United States Patent
Collison et al.

(10) Patent No.: US 6,692,649 B2
(45) Date of Patent: Feb. 17, 2004

(54) INDUCTIVELY COUPLED PLASMA DOWNSTREAM STRIP MODULE

(75) Inventors: Wenli Z. Collison, Fremont, CA (US); Michael S. Barnes, San Francisco, CA (US); Tuqiang O. Ni, Fremont, CA (US); Butch Berney, Pleasanton, CA (US); Wayne W. Vereb, Pleasanton, CA (US); Brian K. McMillin, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 378 days.

(21) Appl. No.: 09/765,920

(22) Filed: Jan. 18, 2001

(65) Prior Publication Data

US 2001/0023741 A1 Sep. 27, 2001

Related U.S. Application Data

(62) Division of application No. 09/052,906, filed on Mar. 31, 1998, now Pat. No. 6,203,657.

(51) Int. Cl.[7] ............................................... H01L 21/00
(52) U.S. Cl. ...................... 216/67; 216/68; 156/345.29; 156/345.3; 156/345.35; 156/345.48; 118/723 ER; 118/723 IR; 118/723 ME; 118/723 MP; 118/715; 118/719
(58) Field of Search ..................... 156/345.29, 345.3, 156/345.35, 345.48; 118/723 ER, 723 IR, 723 ME, 723 MP, 715, 719; 216/63, 67, 68

(56) References Cited

U.S. PATENT DOCUMENTS

| | | | |
|---|---|---|---|
| 4,691,662 A | 9/1987 | Roppel et al. | 118/50.1 |
| 4,736,087 A | 4/1988 | Whitlock et al. | 219/121 PG |
| 4,948,458 A | 8/1990 | Ogle | 156/643 |

(List continued on next page.)

OTHER PUBLICATIONS

S. Savas et al, "Advanced Photoresist Strip with a High Pressure ICP Source," Oct. 1996, Solid State Technology, pp. 123–128.

(List continued on next page.)

Primary Examiner—Allan Olsen
(74) Attorney, Agent, or Firm—Beyer Weaver & Thomas, LLP

(57) ABSTRACT

A plasma processing module for processing a substrate includes a plasma containment chamber having a feed gas inlet port capable of allowing a feed gas to enter the plasma containment chamber of the plasma processing module during the processing of the substrate. An inductively coupled source is used to energize the feed gas and striking a plasma within the plasma containment chamber. The specific configuration of the inductively coupled source causes the plasma to be formed such that the plasma includes a primary dissociation zone within the plasma containment chamber. A secondary chamber is separated from the plasma containment chamber by a plasma containment plate. The secondary chamber includes a chuck and an exhaust port. The chuck is configured to support the substrate during the processing of the substrate and the exhaust port is connected to the secondary chamber such that the exhaust port allows gases to be removed from the secondary chamber during the processing of the substrate. A chamber interconnecting port interconnects the plasma containment chamber and the secondary chamber. The chamber interconnecting port allows gases from the plasma containment chamber to flow into the secondary chamber during the processing of the substrate. The chamber interconnecting port is positioned between the plasma containment chamber and the secondary chamber such that, when the substrate is positioned on the chuck in the secondary chamber, there is no substantial direct line-of-sight exposure of the substrate to the primary dissociation zone of the plasma formed within the plasma containment chamber.

15 Claims, 4 Drawing Sheets

U.S. PATENT DOCUMENTS

| | | | |
|---|---|---|---|
| 4,996,077 A | 2/1991 | Moslehi et al. | 427/38 |
| 5,114,529 A | 5/1992 | Masuyama et al. | 156/643 |
| 5,231,334 A | 7/1993 | Paranjpe | 315/111.21 |
| 5,310,703 A | 5/1994 | Visser et al. | 437/229 |
| 5,346,578 A | 9/1994 | Benzing et al. | 156/345 |
| 5,534,231 A | 7/1996 | Savas | 216/67 |
| 5,614,026 A | 3/1997 | Williams | 118/723 ME |
| 5,614,055 A | 3/1997 | Fairbairn et al. | 156/345 |
| 5,673,456 A | 10/1997 | Berge et al. | 15/250.351 |
| 5,811,022 A | 9/1998 | Savas et al. | 216/68 |
| 5,888,414 A | 3/1999 | Collins et al. | 216/68 |
| 5,942,854 A | 8/1999 | Ryoji et al. | 315/111.21 |

OTHER PUBLICATIONS

P. Singer, "Plasma Ashing Moves Into the Mainstream," Aug. 1996, Semiconductor International, pp. 83–88.

J. Shi, "Damage Reduction in Dry Resist Stripping Systems," Oct. 1995, Solid State Technology, pp. 75–82.

R. De Jule, "Managing Etch and Implant Residue," Aug. 1997, Semiconductor International, 56–62.

"Matrix, A Quick Overview: Integrated Dry Processing," Aug. 1997, Matrix, 21 pages.

"Aura 1000 Chamber Configuration," GaSonics International vol. III.B5a.8, 1 page.

C. Boitnott, "Downstream Plasma Processing: Considerations for Selective Etch and other Processes," Oct. 1994, Solid State Technology, pp. 51–58.

Patent application No. 08/994,552 Filed Dec. 19, 1997 Entitled "Method and Composition for Drying Etching in Semiconductor Fabrication," 19 pages.

Patent application No. 08/892,610 Filed Jul. 14, 1997 Entitled "Compact Microwave Downstream Plasma System," 29 pages.

US 6,692,649 B2

INDUCTIVELY COUPLED PLASMA DOWNSTREAM STRIP MODULE

This is a Divisional application of prior application Ser. No. 09/052,906 filed on Mar. 31, 1998, now U.S. Pat. No. 6,203,657.

BACKGROUND OF THE INVENTION

The present invention relates to plasma processing modules for the processing of a semiconductor substrate in the manufacture of integrated circuits. More particularly, the present invention relates to downstream, inductively coupled plasma processing modules and methods of using the modules during the processing of the semiconductor substrates.

Semiconductor substrates are typically processed using plasma processing modules to perform various process steps during the manufacture of the semiconductor devices. Generally, these plasma-enhanced processes are well known to those skilled in the art and include various etching processes and stripping processes.

In recent trends, plasma-enhanced processes have been more frequently used to perform resist stripping. Traditionally, the resist stripping or ashing process has been considered a fairly straight forward process. However, due to the small feature size and increased complexity of devices now common in the semiconductor industry, conventional plasma processing modules tend to cause plasma-induced damage to the semiconductor devices during the processing of the semiconductor substrates. To more thoroughly illustrate the problems associated with the use of conventional plasma processing modules, a prior art inductively coupled plasma processing module 100 will be described with reference to FIG. 1.

As illustrated in FIG. 1, plasma processing module 100 includes a plasma chamber 102 formed by chamber walls 104 and dielectric window 106. Plasma processing module 100 includes a feed gas inlet 108 for allowing feed gasses 109 to flow into chamber 102. An exhaust port 110 is also provided for exhausting gases from chamber 102. An inductive source 112, typically taking the form of a coil positioned on dielectric window 106, is used to energize feed gases 109 within chamber 102 and strike a plasma within the chamber. In this example, inductive source 112 is powered by RF power supply 114.

With the above described configuration, the shape of inductive source 112 causes the plasma within chamber 102 to form a plasma having a primary dissociation zone 116. This primary dissociation zone is the region within the chamber that the plasma most efficiently dissociates feed gases 109 (for example $O_2$ and $H_2O$ vapor) into neutral non-charged species (for example O, H, and OH). In the case in which inductive source 112 takes the form of a coil attached to dielectric window 106, primary dissociation zone 116 takes the form of a generally donut shaped region located within chamber 102 directly below the coils of inductive source 112.

Still referring to FIG. 1, plasma processing module 100 also includes a liner 118, such as a quartz liner, for protecting the walls of the plasma chamber from the plasma and reducing the recombination of neutral radicals like O or OH. A chuck 120 is positioned in the bottom of chamber 102 and is configured to support a semiconductor substrate 122. As is known in the art, chuck 120 may be heated to improve the efficiency of the process. Plasma processing module 100 also includes a quartz baffle 124 located above substrate 122. Baffle 124 includes a plurality of openings 126 formed through baffle 124 which cause any gases flowing through chamber 102 to be redistributed so that the gases flow more evenly over substrate 122 than would be the case if baffle 124 were not included in module 100.

Although baffle 124 partially shields substrate 122 from direct exposure to the plasma, portions of substrate 122 remain directly exposed to the plasma. This exposure to the substrate to the plasma may cause different types of the plasma-induced damage. For example, in semiconductor substrates having small feature sizes such as 0.25 $\mu m$ devices, charge damage can occur when electrically charged species from the plasma accumulate non-uniformly on device gates and interconnections. This charge accumulation can lead to large voltage potentials across individual gates or between devices that can cause gate degradation or loss of gate integrity. Device damage has been found to correlate with the charge species dose that the device is exposed to during the process. Therefore, exposing the device directly to charged species produced within the plasma at high concentration (e.g., >$10^{11}/cm^3$) for even a short duration of time (e.g., seconds) or moderate concentration (e.g., $10^9/cm^3$ to $10^{10}/cm^3$) for a longer duration (e.g., tens of seconds) can cause significant problems for this type of device. In another example, device damage has been attributed to direct UV radiation exposure from the plasma. In the conventional configuration of an inductively coupled plasma processing module, such as module 100 described above, portions of substrate 122 are directly exposed to UV radiation from the plasma.

Another problem associated with conventional inductively coupled plasma processing modules such as module 100 is that they often provide relatively poor dissociation of the feed gases. In some cases, much of the RF energy is input into ionization at the expense of dissociation of the feed gas. This poor dissociation decreases the efficiency of and therefore increases the time necessary for processing, further contributing to the above described problem of charge damage to devices on the substrate. This poor dissociation is at least in part due to the fact that the feed gases 109 are not forced to flow directly through the primary dissociation zones 116. As mentioned above, primary dissociation zones 116 are the regions within chamber 102 in which the plasma most efficiently dissociates the feed gases.

The present invention provides improved designs for inductively coupled plasma processing modules and methods of using the novel modules to process semiconductor substrates. These designs provide an isolated plasma containment chamber within the module. This isolated plasma containment chamber prevents the semiconductor substrate from being directly exposed to line-of-sight UV radiation produced by the plasma and substantially reduces the concentration of charged species that the semiconductor substrate is exposed to compared to prior art inductively coupled plasma processing modules. Also, the plasma processing modules of the present invention provide a module that improves the dissociation of the feed gases compared to prior art inductively coupled plasma processing modules. This is accomplished by specifically controlling the flow of gases through the module.

SUMMARY OF THE INVENTION

As will be described in more detail hereinafter, a plasma processing module and methods of using the plasma processing module to process a substrate are herein disclosed. The plasma processing module of the present invention includes a plasma containment chamber having a feed gas inlet port capable of allowing a feed gas to enter the plasma containment chamber of the plasma processing module during the processing of the substrate. An inductively coupled source is used to energize the feed gas and for striking a plasma within the plasma containment chamber. The specific configuration of the inductively coupled source causes the plasma to be formed such that the plasma includes a primary dissociation zone within the plasma containment chamber. A secondary chamber is separated from the plasma containment chamber by a plasma containment plate or shield. The secondary chamber includes a chuck and an exhaust port. The chuck is configured to support the substrate during the processing of the substrate and the exhaust port is connected to the secondary chamber such that the exhaust port allows gases to be removed from the secondary chamber during the processing of the substrate. A chamber interconnecting port interconnects the plasma containment chamber and the secondary chamber. The chamber interconnecting port allows gases from the plasma containment chamber to flow into the secondary chamber during the processing of the substrate. The chamber interconnecting port is positioned between the plasma containment chamber and the secondary chamber such that, when the substrate is positioned on the chuck in the secondary chamber, there is no substantial direct line-of-sight exposure of the substrate to the primary dissociation zone of the plasma formed in the plasma containment chamber.

In one embodiment, the feed gas inlet port and the chamber interconnecting port are connected to the plasma containment chamber such that the flow of any feed gases fed into the plasma containment chamber through the feed gas inlet port is directed substantially through the primary dissociation zone of the plasma within the plasma containment chamber. In another embodiment, the feed gas inlet port and the chamber interconnecting port are connected to the plasma containment chamber such that the flow of any feed gases fed into the plasma containment chamber through the feed gas inlet port is caused to pass substantially through the primary dissociation zone of the plasma within the plasma containment chamber two times.

Preferably, the secondary chamber further includes a baffle plate having a plurality of openings formed through the baffle plate. The baffle plate is positioned within the secondary chamber above the substrate such that the plurality of openings in the baffle plate cause any gases moving through the secondary chamber and out the exhaust port to flow over the substrate in a more uniformly distributed flow pattern compared to what the flow pattern would be without the baffle plate. Also, the plasma containment plate separating the plasma containment chamber from the secondary chamber is preferably grounded.

In still another embodiment, the module further includes an additional feed gas port. The additional feed gas port is positioned such that additional feed gases may be injected into the plasma processing module without having the additional feed gases flow through the plasma containment chamber. In one version of this embodiment, the additional feed gas port is connected to the secondary chamber such that additional feed gases may be injected into the secondary chamber without passing through the plasma containment chamber.

In one embodiment, the plasma processing module includes an RF power supply for powering the inductively coupled source of the module. Additionally, the module may further include a biasing arrangement connected to the chuck in the secondary chamber. This biasing arrangement is configured to apply a bias capable of inducing a plasma within the secondary chamber. In one version of this embodiment, the biasing arrangement is configured to apply a soft bias capable of inducing a plasma having a plasma density of no more than about $10^8$ ions/cm$^3$. In one specific example, the biasing arrangement includes an RF power supply for applying the bias.

The various embodiments of the plasma processing module of the present invention may be used in a variety of methods of processing a substrate within a plasma processing module. In one embodiment, a substrate is placed within the secondary chamber of the processing module. A feed gas is then caused to be fed into the plasma containment chamber through the feed gas inlet port. A plasma is energized within the plasma containment chamber using an inductively coupled source to energize the feed gas within the plasma containment chamber. The gases are drawn through the plasma processing module by exhausting the gases from the secondary chamber through the exhaust port. These gases are used to perform certain processes on the substrate.

In one embodiment of a method of the invention, the process of the method is a stripping process for stripping a resist layer from the substrate. In one version of this method, the step of feeding a feed gas into the plasma processing chamber includes the step of feeding $O_2$ and $H_2O$ vapor into the plasma processing chamber.

In another embodiment of a method of the invention, a plasma processing module that includes the biasing arrangement connected to the chuck in the secondary chamber is used. The plasma processing module also includes an additional feed gas port positioned such that additional feed gases may be injected into the plasma processing module without having the additional feed gases flow through the plasma containment chamber. The process of this method is a stripping process for stripping a resist layer and various residues from the substrate. In this embodiment, an additional fluorine containing feed gas is injected into the plasma processing module through the additional feed gas port. Also, a soft bias is applied to the chuck such that a plasma is induced within the secondary chamber. In one version of this embodiment, a bias of between about 20–500 W, and preferably 20–200 W for a 200 mm substrate (about 0.6 to about 0.65 W/cm$^2$) is applied thereby inducing a plasma having a plasma density of preferably no more than about $10^8$ ions/cm$^3$ and at most about $10^9$ ions/cm$^3$.

BRIEF DESCRIPTION OF THE DRAWINGS

The features of the present invention may best be understood by reference to the following description of the presently preferred embodiments together with the accompanying drawings.

DETAILED DESCRIPTION OF THE PREFERRED EMBODIMENTS

An invention is described herein for providing a downstream, inductively coupled plasma processing module and methods of using the module during the processing of a semiconductor substrate. In the following description, numerous specific details are set forth in order to provide a thorough understanding of the present invention. However, it will be obvious to one skilled in the art that the present invention may be embodied in a wide variety of specific configurations. Also, well known plasma-enhanced processes and other processes associated with the production of integrated circuits on semiconductor substrates will not be described in detail in order not to unnecessarily obscure the present invention.

Although the inventive plasma processing module will be described as an inductively coupled plasma processing module using an inductively coupled RF transformer coupled source, the inventive module may be powered using any inductively coupled source such as helicon or helical resonators. These power sources, among others, are readily available commercially.

Figure 1:
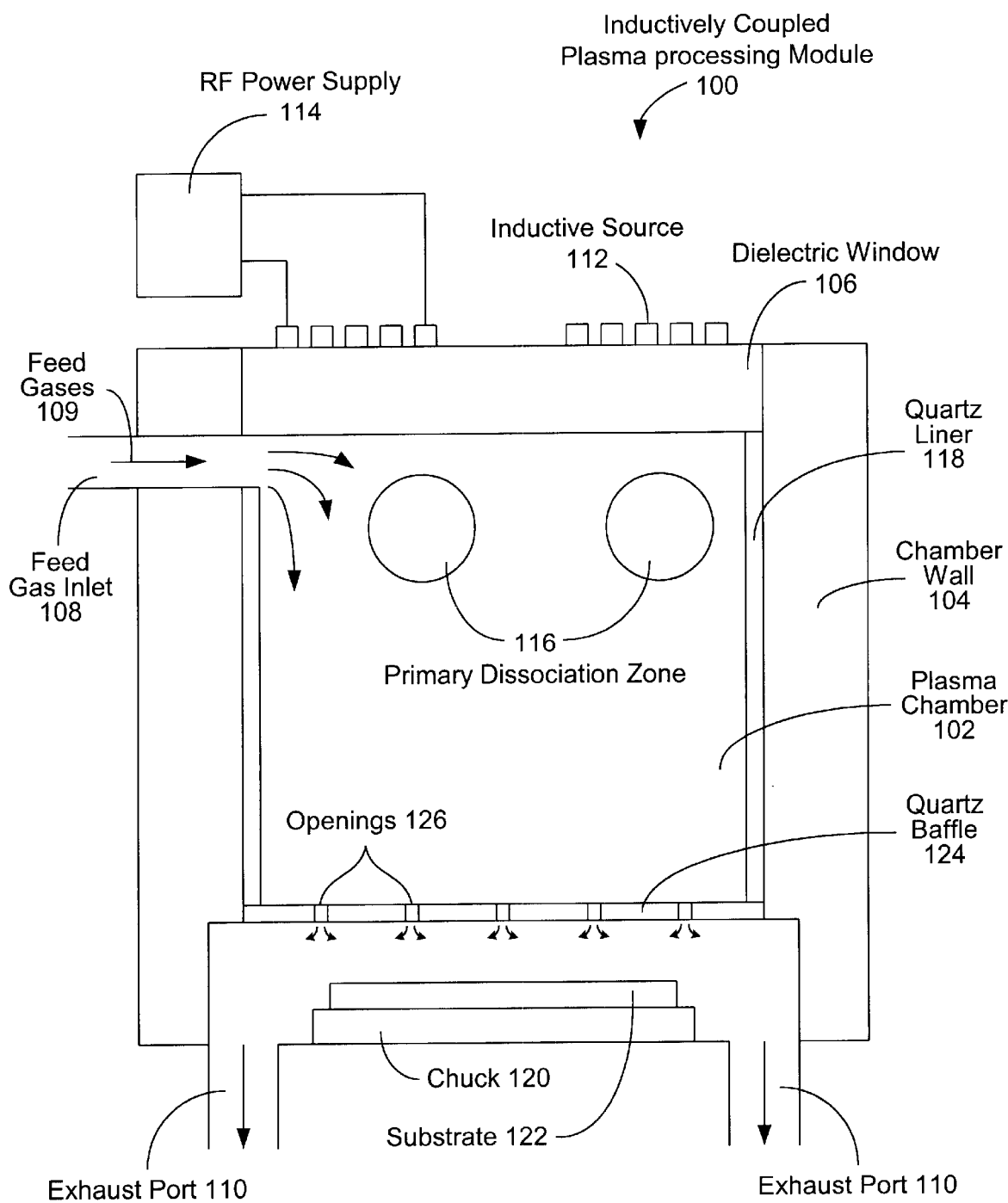
FIG. 1 is a simplified cross-sectional view of a prior art inductively coupled plasma processing module.
Figure 2A:
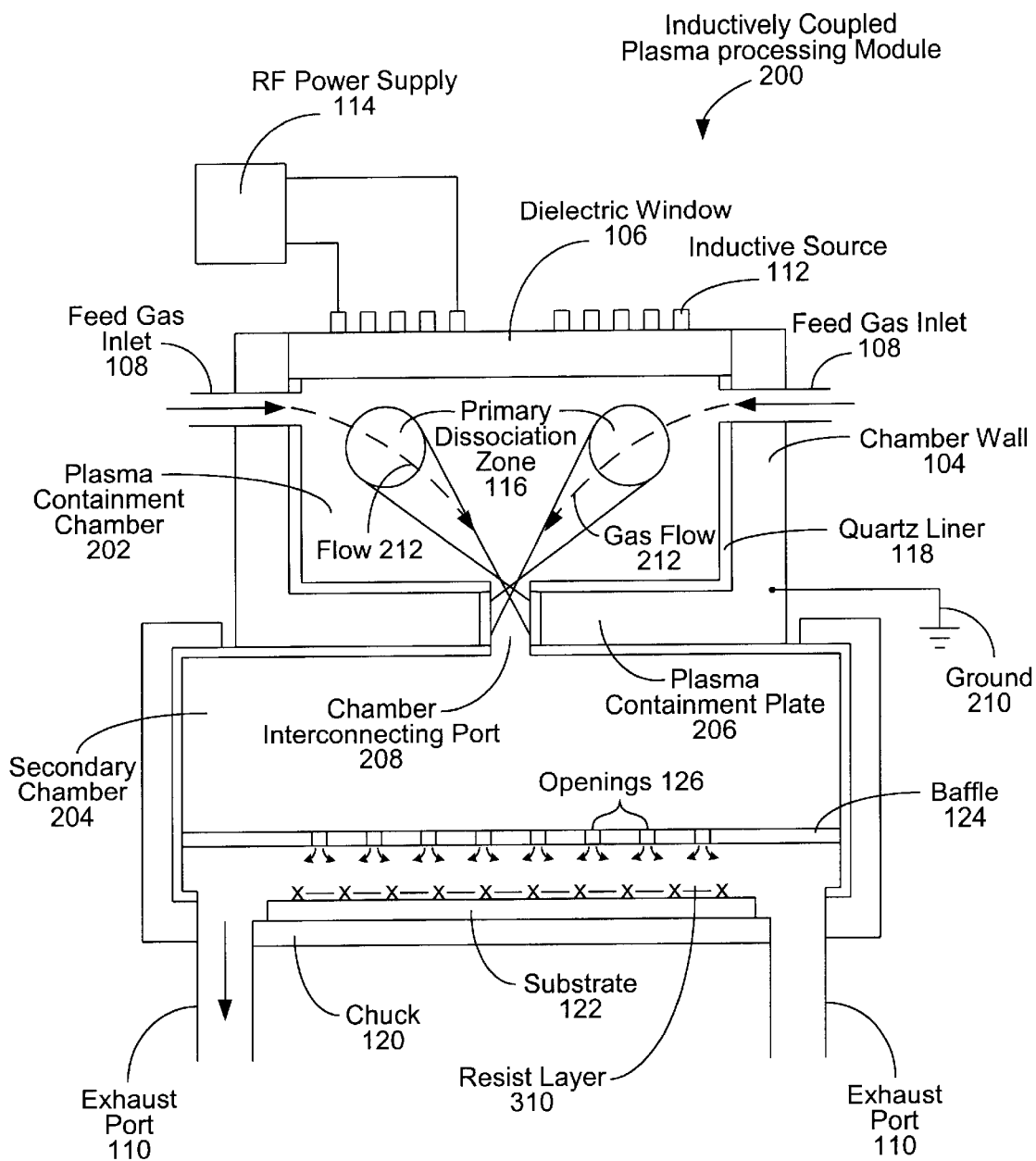
FIG. 2A is a cross sectional view of a first embodiment of an inductively coupled plasma processing chamber designed in accordance with the invention.

FIG. 2A illustrates a simplified schematic of a downstream, inductively coupled plasma processing module 200 designed in accordance with the present invention. For illustrative purposes, like reference numerals will be used throughout the various figures for like components. Generally, module 200 is a module similar to module 100 described above except that, in accordance with the invention, module 200 includes a plasma containment chamber 202 and a secondary chamber 204. That is, module 200 includes a plasma containment plate or shield 206 that separates plasma containment chamber 202 from secondary chamber 204.

In a manner similar to that described above in the background for module 100, plasma containment chamber 202 and secondary chamber 204 are formed by chamber walls 104 and dielectric window 106. Plasma processing module 200 also includes feed gas inlet 108 for allowing feed gasses 109 to flow into plasma containment chamber 202. Exhaust ports 110 are also provided for exhausting gases from secondary chamber 204. Inductive source 112, in this case taking the form of a coil positioned above dielectric window 106, is used to energize feed gases 109 within plasma containment chamber 202 and strike a plasma within plasma containment chamber 202. In this example, inductive source 112 is powered by RF power supply 114 which takes the form of a transformer coupled source. Typical inductive source power ranges from about 250 W to about 5000 W or more.

With the above described arrangement, the specific configuration and shape of inductive source 112 causes the plasma within plasma containment chamber 202 to form a plasma having primary dissociation zone 116. As described above, this primary dissociation zone is the region within the chamber that the plasma most efficiently dissociates feed gases 109 into neutral non-charged species. In the case in which inductive source 112 takes the form of a coil attached to dielectric window 106, primary dissociation zone 116 takes the form of a generally donut shaped region located within plasma containment chamber 202 directly below the coils of inductive source 112.

Plasma processing module 200 also includes liner 118 for protecting the walls of plasma containment chamber 202 and secondary chamber 204 from corrosion or erosion and for reducing recombination of reactive radicals. Liner 118 may be a quartz liner or any other suitable and readily available liner material capable of protecting the chamber walls. Chuck 120 is positioned in the bottom of secondary chamber 204 and is configured to support semiconductor substrate 122. As is known in the art, chuck 120 may be heated to improve the efficiency of the process. As was described above for module 100 plasma processing module 200 also includes quartz baffle 124 located above substrate 122. Baffle 124 includes openings 126 formed through baffle 124 which cause any gases flowing through secondary chamber 204 to be redistributed so that the gases flow more evenly over substrate 122 than would be the case if baffle 124 were not included in module 200.

During plasma processing, the gas pressure within the plasma containment and secondary chambers may be from about 10 mT to about 10 T or more, but typically the operating pressure is about 1 T. Feed gas flow may range from about 100 standard cubic centimeters per minute (sccm) to about 5,000 sccm or more for a 200 mm substrate.

In accordance with the invention, module 200 further includes a chamber interconnecting port 208 that interconnects plasma containment chamber 202 and the secondary chamber 204. Chamber interconnecting port 208 allows gases from plasma containment chamber 202 to flow into secondary chamber 204 during the processing of the substrate. Chamber interconnecting port 208 is positioned between plasma containment chamber 202 and secondary chamber 204 such that, when substrate 122 is positioned on chuck 120 in the secondary chamber, there is preferably no substantial direct line-of-sight exposure of substrate 122 to the primary dissociation zone 116 of the plasma formed within plasma containment chamber 202. If desired (but not required in all cases), chamber interconnecting port 208 may be positioned between plasma containment chamber 202 and secondary chamber 204 such that there is no point on substrate 122 that is in direct line-of sight with the primary dissociation zone 116 of the plasma formed within plasma containment chamber 202.

Because chamber interconnecting port 208 is positioned between plasma containment chamber 202 and secondary chamber 204 such that no points on substrate 122 are in direct line-of-sight with the primary dissociation zone 116 when the substrate is positioned on chuck 120, the module configuration of the invention substantially eliminates the potential for damage to the substrate due to direct UV radiation. More importantly, because primary dissociation zone 116 of the plasma is substantially surrounded by the chamber walls of plasma containment chamber 202, the vast majority of charged species formed within plasma containment chamber 202 collide with one of the walls. This substantially reduces the concentration of charged species that are able to pass through chamber interconnecting port 208 and into secondary chamber 204. This substantial reduction of the concentration of charged species that are allowed to pass through chamber interconnecting port 208 substantially reduces the dosage of charged species that substrate 122 is exposed to. This reduces the chances of causing the charge damage to any devices on substrate 122 as described above in the background.

In one preferred embodiment, plasma containment plate 206 is grounded as indicated by ground 210 in FIG. 2A. This grounding causes containment plate 206 to attract any charged species and further encourages any charged species to collide with containment plate 206. This further prevents charged species from passing from plasma containment chamber 202 into secondary chamber 204.

In another aspect of the invention, feed gas inlet 108 and chamber interconnecting port 206 are connected to plasma containment chamber 202 such that the flow of any feed gases 109 fed into the plasma containment chamber is directed substantially through primary dissociation zone 116 of the plasma within plasma containment chamber 202. This is illustrated by arrows 212 in FIG. 2A. By placing feed gas inlet 108 and chamber interconnecting port 208 on substantially opposite sides of dissociation zone 116, this configuration improves the efficiency at which the fed gas is dissociated and reduces processing time and/or reduces the damage to the substrate due to charged species. This configuration also helps prevent charged species from moving from plasma containment chamber 202 into secondary chamber 204. This configuration also improves the efficiency at which the module produces the desirable neutral species that are used for processing the substrate compared to prior art modules thereby improving the efficiency of the overall module.

Figure 2B:
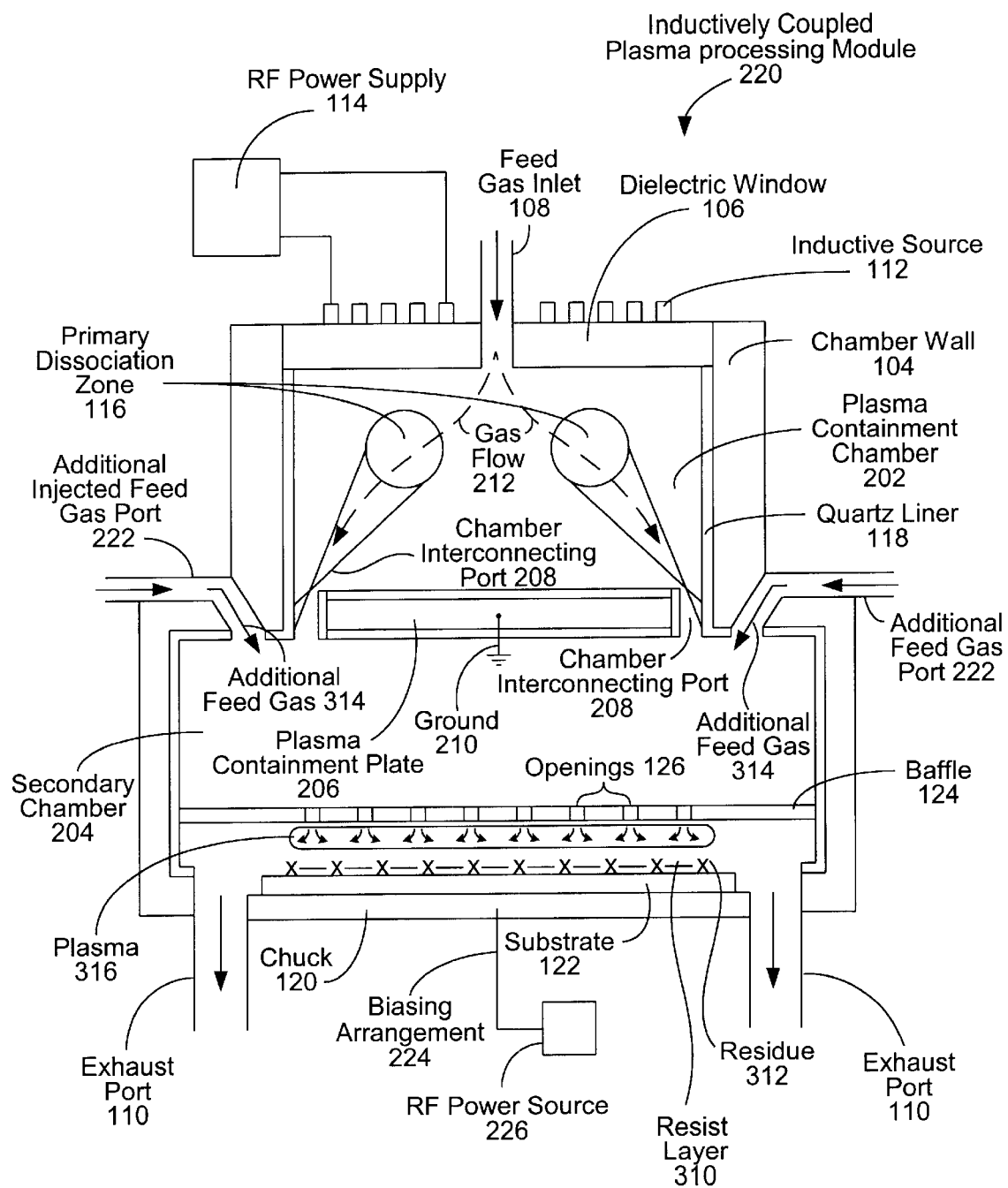
FIG. 2B is a cross sectional view of a second embodiment of an inductively coupled plasma processing chamber designed in accordance with the invention.

Referring now to FIG. 2B, several additional features that may be included in the novel module design will now be described with reference to module 220 of FIG. 2B. Although FIG. 2A illustrates feed gas inlet 208 as being multiple inlets located on the outer periphery of plasma containment chamber 202 and chamber interconnecting port 208 as being located in the center of plasma containment plate 206, this is not a requirement. Instead, feed gas inlet 208 may be a single inlet located in the center of the top of plasma containment chamber 202 and chamber interconnecting port 208 may be multiple ports located around the periphery of plasma containment plate 206 as illustrated in FIG. 2B. This configuration causes feed gases 109 to substantially flow through primary dissociation zone 116 as illustrated by arrows 212 in FIG. 2B and in a manner similar to that described above for FIG. 2A. Although this specific alternative is given, it should be understood that any appropriate positioning of the feed gas inlet and the chamber interconnecting port would equally fall within scope of the invention so long as their positioning prevents substrate 122 from having any significant direct line-of-site exposure to primary dissociation zone 116 as described above.

As also illustrated in FIG. 2B, and in accordance with the invention, plasma processing module 220 may further include an additional feed gas port 222. The additional feed gas port is positioned such that additional feed gases may be injected into the plasma processing module without having the additional feed gases flow through the plasma containment chamber. In the embodiment shown in FIG. 2B, additional feed gas ports 222 are connected to the secondary chamber such that additional feed gases may be injected into the secondary chamber without passing through the plasma containment chamber. Injecting the secondary gas in this manner may be advantageous since the secondary feed gas which may contain fluorine species is largely separated from the high ion concentration regions, which reduces potential erosion of the liner.

As described above, the plasma processing module includes an RF power supply for powering the inductively coupled source of the module. Additionally, the module may further include a biasing arrangement 224 connected to the chuck in the secondary chamber. This biasing arrangement is configured to apply a bias capable of inducing a plasma within the secondary chamber. In one version of this embodiment, the biasing arrangement is configured to apply a soft bias capable of inducing a plasma having a plasma density of no more than about $10^8$ ions/cm$^3$. In this specific example, the biasing arrangement includes an RF power supply 226 for applying the bias.

Figure 3:
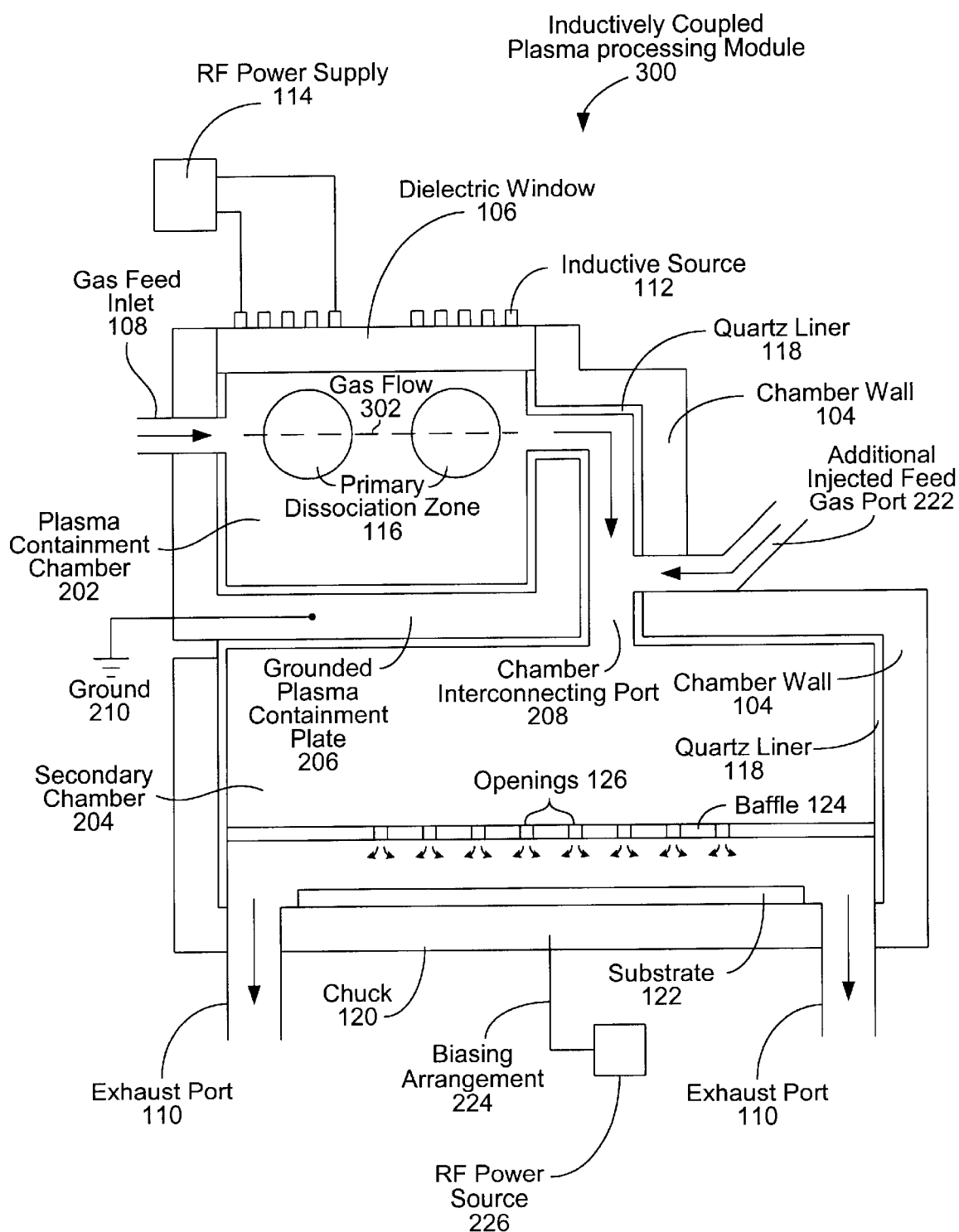
FIG. 3 is a cross sectional view of a third embodiment of an inductively coupled plasma processing chamber designed in accordance with the invention.

In another embodiment of a plasma processing module illustrated in FIG. 3 and indicated by reference numeral 300, feed gas inlet 108 and chamber interconnecting port 208 are connected to the plasma containment chamber such that the flow of any feed gases 109 fed into plasma containment chamber 202 through feed gas inlet 108 is caused to pass substantially through primary dissociation zone 116 of the plasma within the plasma containment chamber two times. This is illustrated by arrows 302 in FIG. 3. In the embodiment shown, this is accomplished by shifting plasma containment chamber 202 of the module over to one side of the module. This allows feed gas inlet 108 to be positioned on one side of plasma containment chamber 202 and chamber interconnecting port 208 to be located on the opposite side of plasma containment chamber 202.

The above described positioning of inlet 108 and port 208 forces any feed gas 109 fed into plasma containment chamber 202 to pass substantially through primary dissociation zone 116 of the plasma two times as indicated by gas flow arrows 302. Because the feed gasses are forced to pass through the primary dissociation zone twice, this configuration further improves the efficiency at which the module dissociates the feed gas into neutral species rather than charged species. Also, since chamber interconnecting port 208 now includes a right angle bend, this configuration insures that there is no direct line-of sight exposure of the substrate to the primary dissociation zone 116. Additionally, the chamber walls 104 that help form chamber interconnecting port 208 may be grounded. This grounding of these walls attracts any charged species causing them to collide with the wall thereby helping to prevent the charged species from flowing from the plasma containment chamber into the secondary chamber.

The various embodiments of the plasma processing module of the present invention may be used in a variety of methods of processing a substrate within a plasma processing module. In one embodiment illustrated in FIG. 2A, substrate 122 is placed on chuck 120 within secondary chamber 204 of plasma processing module 200. Feed gas 109 is then caused to be fed into the plasma containment chamber through feed gas inlet 108. A plasma is energized within plasma containment chamber 202 using inductively coupled source 112 to energize feed gas 109 within plasma containment chamber 202. The gases are drawn through the plasma processing module by exhausting the gases from secondary chamber 204 through exhaust ports 110. This is typically done using a vacuum pump connected to exhaust ports 110 as is known in the art. The gases moving through secondary chamber 204 are used to perform certain processes on substrate 122.

In the embodiment of the method of the invention currently being described, the process of the method is a stripping process for stripping a resist layer 310 from substrate 122. In one version of this method, oxygen and water vapor are fed into the plasma processing chamber as the feed gas. This feed gas is dissociated into various species including O, H, OH, O$^+$, O$_2^+$, electrons, H$^+$, and OH$^-$. However, since the feed gas is forced to flow substantially through primary dissociation zone 116 as described above, a higher percentage of the feed gas is dissociated into desirable neutral species (i.e. O) that may be used to strip resist layer 310 from substrate 122.

In another embodiment of a method of the invention illustrated in FIG. 2B, plasma processing module 220, which includes biasing arrangement 224 connected to chuck 120 in secondary chamber 204, is used. Plasma processing module 220 also includes additional feed gas ports 222 positioned such that additional feed gases 314 may be injected into plasma processing module 220 without having additional feed gases 314 flow through plasma containment chamber 202. The process of this method is also a stripping process for stripping a resist layer as described above. However, this process is also able to strip various residues, indicated by residues 312 in FIG. 2B, from substrate 122. In this embodiment, additional feed gas 314 is a fluorine containing feed gas that is injected into secondary chamber 204 through additional feed gas ports 222. Also, a soft bias is applied to chuck 120 using biasing arrangement 224 such that a plasma 316 is induced within secondary chamber 204. In one version of this embodiment, a bias of between about 20–200 W is applied to chuck 120. This relatively soft bias induces plasma 316 such that plasma 316 has a plasma density of no more than about $10^8$ ions/cm$^3$.

Although the above described method has been described as using a specific range of biasing that induces a specific plasma density, it should be understood that this is not a requirement of the invention. Instead, as would be understood by those skilled in the art, the amount of bias applied and the plasma density may be varied to suit the specific application.

The above described method of using additional feed gases and applying a soft bias to induce a low density plasma provides a unique plasma processing method that is very useful in a wide variety of resist and residue stripping applications. For example, etching applications with features of 0.25 μm often require sidewall passivation chemistries to maintain the required feature profile and critical dimensions. In typical poly etch applications, for example, $Cl_2$ and HBr are used in conjunction with $O_2$ or $N_2$ additives. Sidewall residues which are composed of Si and one or more of Br, Cl, O, N, and C (from the photoresist) are formed during the main and overetch processes. These sidewall residues must be removed before the substrate can be further processed. One possible alternative is to wet strip the residues. However, it would be advantageous to be able to remove these residues during a plasma strip process. This can be accomplished in some applications by applying a soft and low power bias (20–200 W) during a remote inductively coupled plasma strip process as described above. A typical resist stripping chemistry would be largely composed of $O_2$ with a dilute addition of fluorine containing species such as $CF_4$, $C_2F_6$, $NF_3$, or $SF_6$.

In oxide etch applications such as via etch, sidewall residues formed during the main etch and overetch steps may also not be successfully removed during a plasma resist strip. These residues associated with vias are often referred to as "veils" and may contain titanium and/or aluminum compounds because the underlying layer in a typical via etch may be Ti/TiN (often used as an antireflective coating on aluminum interconnections) or aluminum layers. During the overetch process, for example, material from the bottom of the via is sputtered onto the sidewalls which leads to the formation of the veils. These residues are particularly difficult to remove even with fluorinated chemistries. Hence, it can be advantageous to apply a soft bias (again 20–100 W) to ensure that the via veils are removed during the photoresist stripping process.

Depending upon the specific application, the soft bias may not be applied at all in some resist strip processes. However, it may be applied during a portion or all of other resist strip processes. Additionally, the remote inductively coupled plasma process of the present invention may be applied to photoresist stripping following metal (aluminum) etching. In this application, the primary concern is corrosion protection where the goal is to remove the chlorine species from the metal lines prior to exposing them to the atmosphere. Chlorine present on the metal lines can form HCl when exposed to moist air.

Since the above described processes that utilize a bias applied to the chuck generally use a soft bias, this general approach avoids causing charge damage to the devices on the substrate. Device charge damage has been found to correlate with charge species dose to the device. With the high density plasma being generated in a remote plasma containment chamber in this invention, the current dose to the device even with the soft bias applied in the secondary chamber is low enough to not cause device damage. This is because the plasma density induced by the soft bias is typically less than $10^8$ ions/cm$^3$.

Although only a few specific embodiments of a plasma processing module have been described in detail herein, it is to be understood that the present invention is not limited to these specific configurations. In fact, the invention would equally apply regardless of the specific configuration of the module so long as an the high density plasma formed in the plasma containment chamber is energized using an inductively coupled source and so long as the substrate located in the secondary chamber has no substantial line-of-sight exposure to the primary dissociation zone of the plasma in the plasma containment chamber.

Also, while only a few specific examples of methods of how a plasma processing module of the invention may be used to process a substrate have been described in terms of several preferred embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. A method of processing a substrate within a plasma processing module, the method comprising the steps of:
   a) providing a plasma processing module including
      i) a plasma containment chamber having a feed gas inlet port capable of allowing a feed gas to enter the plasma containment chamber of the plasma processing module during the processing of the substrate,
      ii) a secondary chamber,
      iii) a plasma containment plate separating the plasma containment chamber from the secondary chamber,
      iv) a chamber interconnecting port that interconnects the plasma containment chamber and the secondary chamber allowing gases from the plasma containment chamber to flow into the secondary chamber during the processing of the substrate; and
      v) a baffle extending across the secondary chamber;
   b) placing a substrate within the secondary chamber, the secondary chamber including a chuck and an exhaust port, the chuck being configured to support the substrate during the processing of the substrate and the exhaust port being connected to the secondary chamber such that the exhaust port allows gases to be removed from the secondary chamber during the processing of the substrate, wherein said baffle extends across the secondary chamber between the chamber interconnecting port and the substrate;
   c) causing a feed gas to be fed into the plasma containment chamber through the feed gas inlet port;
   d) using an inductively coupled source to energize the feed gas within the plasma containment chamber and strike a plasma within the plasma containment chamber, the specific configuration of the inductively coupled source causing the plasma to be formed such that the plasma includes a primary dissociation zone within the plasma containment chamber;

e) grounding said plasma containment plate;
f) flowing gases from said plasma containment chamber through said chamber interconnecting port to said secondary chamber;
g) flowing gases from said interconnecting port through said baffle extending across said secondary chamber to said substrate; and
h) exhausting gases from the secondary chamber through the exhaust port such that the feed gas is drawn from the plasma containment chamber through the chamber interconnecting port into the secondary chamber and out of the plasma processing module through the exhaust port, the chamber interconnecting port being positioned between the plasma containment chamber and the secondary chamber such that, when the substrate is positioned on the chuck in the secondary chamber, there is no substantial direct line-of-sight exposure of the substrate to the primary dissociation zone of the plasma formed within the plasma containment chamber.

2. A method according to claim 1 herein the process of the method is a stripping process for stripping a resist layer from the substrate.

3. A method according to claim 2 wherein the step of feeding a feed gas into the plasma processing chamber includes the step of feeding at least one of $O_2$ and $H_2O$ vapor into the plasma processing chamber.

4. A method according to claim 1 wherein the feed gas inlet port and the chamber interconnecting port are connected to the plasma containment chamber such that the flow of any feed gases fed into the plasma containment chamber through the feed gas inlet port is directed substantially through the primary dissociation zone of the plasma within the plasma containment chamber.

5. A method according to claim 1 wherein the baffle causes any gases moving through the secondary chamber and out the exhaust port to flow over the substrate in a more uniformly distributed flow pattern compared to what the flow pattern would be without the baffle plate.

6. A method according to claim 1 wherein the baffle is quartz.

7. A method according to claim 1 further comprising providing additional feed gas injected into the plasma processing module between said plasma containment chamber and said baffle without having the additional feed gas flow through the plasma containment chamber.

8. A method according to claim 7 wherein the additional feed gas is injected into the secondary chamber such that the additional feed is injected into the secondary chamber without passing through the plasma containment chamber.

9. A method according to claim 1 wherein the module includes an RF power supply for powering the inductively coupled source.

10. A method according to claim 1 wherein the plasma processing module further includes a biasing arrangement connected to the chuck in the secondary chamber and wherein the method further includes the step of applying a bias to the biasing arrangement that is capable of inducing a plasma within the secondary chamber.

11. A method according to claim 10 wherein the step of applying a bias to the biasing arrangement includes the step of applying a soft bias to the biasing arrangement thereby inducing a plasma having a plasma density of no more than about $10^8$ ions/cm$^3$.

12. A method according to claim 10 wherein the biasing arrangement includes an RF power supply for applying the bias.

13. A method according to claim 10 wherein
a) the process of the method is a stripping process for stripping a resist layer and various residues from the substrate,
b) the plasma processing module further includes an additional feed gas port positioned such that additional feed gases may be injected into the plasma processing module without having the additional feed gases flow through the plasma containment chamber, and
c) the method further includes the step of injecting an additional fluorine containing feed gas into the plasma processing module through the additional feed gas port.

14. The method, according to claim 1, wherein said baffle is made of a dielectric material.

15. A method of processing a substrate within a plasma processing module, the method comprising the steps of:
a) providing a plasma processing module including
  i) a plasma containment chamber having a feed gas inlet port capable of allowing a feed gas to enter the plasma containment chamber of the plasma processing module during the processing of the substrate,
  ii) a secondary chamber,
  iii) a plasma containment plate separating the plasma containment chamber from the secondary chamber, and
  iv) a chamber interconnecting port that interconnects the plasma containment chamber and the secondary chamber allowing gases from the plasma containment chamber to flow into the secondary chamber during the processing of the substrate;
b) placing a substrate within the secondary chamber, the secondary chamber including a chuck and an exhaust port, the chuck being configured to support the substrate during the processing of the substrate and the exhaust port being connected to the secondary chamber such that the exhaust port allows gases to be removed from the secondary chamber during the processing of the substrate;
c) causing a feed gas to be fed into the plasma containment chamber through the feed gas inlet port;
d) using an inductively coupled source to energize the feed gas within the plasma containment chamber and strike a plasma within the plasma containment chamber, the specific configuration of the inductively coupled source causing the plasma to be formed such that the plasma includes a primary dissociation zone within the plasma containment chamber, wherein the feed gas inlet port and the chamber interconnecting port are connected to the plasma containment chamber such that the flow of any feed gases fed into the plasma containment chamber through the feed gas inlet port is caused to pass substantially through the primary dissociation zone of the plasma within the plasma containment chamber two times; and
e) exhausting gases from the secondary chamber through the exhaust port such that the feed gas is drawn from the plasma containment chamber through the chamber interconnecting port into the secondary chamber and out of the plasma processing module through the exhaust port, the chamber interconnecting port being positioned between the plasma containment chamber and the secondary chamber such that, when the substrate is positioned on the chuck in the secondary chamber, there is no substantial direct line-of-sight exposure of the substrate to the primary dissociation zone of the plasma formed within the plasma containment chamber.

* * * * *